United States Patent
Wang et al.

(10) Patent No.: US 11,138,911 B2
(45) Date of Patent: Oct. 5, 2021

(54) DISPLAY SUBSTRATE AND MANUFACTURING METHOD THEREFOR, AND DISPLAY DEVICE

(71) Applicant: BOE TECHNOLOGY GROUP CO., LTD., Beijing (CN)

(72) Inventors: Hejin Wang, Beijing (CN); Ming Che Hsieh, Beijing (CN); Shanchen Kao, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/617,604

(22) PCT Filed: May 5, 2019

(86) PCT No.: PCT/CN2019/085541
§ 371 (c)(1),
(2) Date: Nov. 27, 2019

(87) PCT Pub. No.: WO2019/214548
PCT Pub. Date: Nov. 14, 2019

(65) Prior Publication Data
US 2020/0184856 A1 Jun. 11, 2020

(30) Foreign Application Priority Data
May 8, 2018 (CN) .......................... 201810432866.8

(51) Int. Cl.
*H01L 27/32* (2006.01)
*G09F 9/30* (2006.01)
*H01L 51/52* (2006.01)

(52) U.S. Cl.
CPC .......... *G09F 9/301* (2013.01); *H01L 27/3248* (2013.01); *H01L 51/5237* (2013.01)

(58) Field of Classification Search
CPC ............. G09F 9/301; H01L 2251/5338; H01L 27/3211; H01L 27/3244
See application file for complete search history.

(56) References Cited

U.S. PATENT DOCUMENTS

2009/0219225 A1* 9/2009 Cope ....................... H01L 33/48
345/55
2011/0140138 A1 6/2011 Ko et al.
(Continued)

FOREIGN PATENT DOCUMENTS

CN 102097457 A 6/2011
CN 102405686 A 4/2012
(Continued)

OTHER PUBLICATIONS

Examination Report dated Mar. 25, 2021 for Indian Patent Application No. 201947048692, 5 pages.

*Primary Examiner* — Michele Fan
(74) *Attorney, Agent, or Firm* — Dave Law Group LLC; Raj S. Dave (57) ABSTRACT

A display substrate and a manufacturing method therefor, and a display device. The display substrate includes a flexible protective layer and sub-pixel structures. The flexible protective layer includes bosses, the sub-pixel structure is provided on a top surface of the boss, the boss further includes multiple side surfaces intersecting with the top surface, and the display substrate further includes secondary sub-pixel structures provided on at least one of the multiple side surfaces.

17 Claims, 4 Drawing Sheets

(56) References Cited

U.S. PATENT DOCUMENTS

| | | | |
|---|---|---|---|
| 2011/0303929 A1* | 12/2011 | Strickler | H01L 33/52 |
| | | | 257/91 |
| 2012/0049175 A1 | 3/2012 | Ono et al. | |
| 2014/0183473 A1* | 7/2014 | Lee | H01L 27/3267 |
| | | | 257/40 |
| 2014/0322836 A1 | 10/2014 | Kim et al. | |
| 2014/0377574 A1 | 12/2014 | Khachatryan | |
| 2015/0380679 A1 | 12/2015 | Fujiyoshi et al. | |
| 2016/0178166 A1* | 6/2016 | Motoki | F21K 9/232 |
| | | | 313/46 |
| 2016/0320878 A1 | 11/2016 | Hong et al. | |
| 2017/0006725 A1 | 1/2017 | Ahn et al. | |
| 2017/0069692 A1 | 3/2017 | Lee et al. | |
| 2018/0284465 A1* | 10/2018 | Kwon | H01L 27/1463 |
| 2020/0111856 A1* | 4/2020 | Lee | H01L 27/3246 |

FOREIGN PATENT DOCUMENTS

| | | |
|---|---|---|
| CN | 102916014 A | 2/2013 |
| CN | 108649054 A | 10/2018 |

\* cited by examiner

DISPLAY SUBSTRATE AND MANUFACTURING METHOD THEREFOR, AND DISPLAY DEVICE

CROSS-REFERENCE

The present application is the U.S. national stage of International Patent Application No. PCT/CN2019/085541, May 5, 2019, which claims the benefit of priority to Chinese patent application No. 201810432866.8, filed on May 8, 2018, the entire disclosures of which are incorporated herein by reference as part of the present application.

TECHNICAL FIELD

Embodiments of the present disclosure relate to a display substrate, a manufacturing method thereof, and a display apparatus.

BACKGROUND

With continuous development of display technologies, a stretchable flexible display apparatus has gradually become a research hotspot and a focus of the market. The stretchable flexible display apparatus is a deformable and bendable display apparatus made of a flexible material, and have a size that can also be increased and stretchable.

The stretchable flexible display apparatus can be applied to different environments by virtue of characteristics of being freely bendable, folded, stretched, etc., so that the scope of application of the display apparatus can be expanded. In addition, the stretchable flexible display apparatus also has advantages of light weight and thinness, small size, low power consumption, good portability and the like, and thus can be applied to a wearable device.

SUMMARY

Embodiments of the present disclosure provide a display substrate, a manufacturing method thereof, and a display substrate. The display substrate includes a flexible protection layer and a sub-pixel structure; the flexible protection layer includes a boss, the sub-pixel structure is provided on a top surface of the boss, and the boss further includes a plurality of lateral surfaces intersecting with the top surface, the display substrate further includes a secondary sub-pixel structure provided on at least one of the plurality of lateral surfaces. Thus, the display substrate can implement high-resolution display upon implementing stretchable flexible display.

At least one embodiment of the present disclosure provides a display substrate, which includes a flexible protection layer and a sub-pixel structure; the flexible protection layer includes a boss, the sub-pixel structure is provided on a top surface of the boss, and the boss further includes a plurality of lateral surfaces intersecting with the top surface, the display substrate further includes a secondary sub-pixel structure provided on at least one of the plurality of lateral surfaces For example, in the display substrate provided by an embodiment of the present disclosure, a shape of a cross section of the boss includes a rectangle or a trapezoid, and the cross section is perpendicular to the top surface.

For example, the display substrate provided by an embodiment of the present disclosure further includes a thin film transistor unit, provided on the top surface of the boss, the thin film transistor unit is connected with the sub-pixel structure and the secondary sub-pixel structure, and configured to drive the sub-pixel structure and the secondary sub-pixel structure to emit light.

For example, the display substrate provided by an embodiment of the present disclosure further includes a plurality of sub-pixel structures, the flexible protection layer includes a plurality of bosses, and the plurality of sub-pixel structures and the plurality of bosses are arranged in one-to-one correspondence.

For example, in the display substrate provided by an embodiment of the present disclosure, the plurality of bosses are arranged in an array along a row direction and a column direction, and the secondary sub-pixel structure is provided on a lateral surface in the plurality of lateral surfaces, which intersects with the row direction.

For example, in the display substrate provided by an embodiment of the present disclosure, the secondary sub-pixel structure is provided on a lateral surface in the plurality of lateral surfaces, which intersects with the column direction.

For example, the display substrate provided by an embodiment of the present disclosure further includes an encapsulation layer, provided on a side of the sub-pixel structure and the secondary sub-pixel structure, which is away from the boss, the encapsulation layer coats the sub-pixel structure and the secondary sub-pixel structure, and an interval is formed between two portions of the encapsulation layer respectively provided on adjacent ones of the plurality of bosses.

For example, in the display substrate provided by an embodiment of the present disclosure, the sub-pixel structure includes a first anode provided on the top surface of the boss and a first light-emitting layer provided on a side of the first anode, which is away from the boss; and the secondary sub-pixel structure includes a second anode provided on at least one of the plurality of lateral surfaces and a second light-emitting layer provided on a side of the second anode, which is away from the boss.

For example, in the display substrate provided by an embodiment of the present disclosure, the first anode and the second anode are electrically connected.

For example, in the display substrate provided by an embodiment of the present disclosure, the first light-emitting layer and the second light-emitting layer are configured to emit light with the same color.

At least one embodiment of the present disclosure further provides a manufacturing method of a display substrate, which includes: forming a protruding portion on a first substrate; forming a sub-pixel structure on a top surface of the protruding portion; and forming a secondary sub-pixel structure on at least one of a plurality of lateral surfaces of the protruding portion, which intersect with the top surface.

For example, in the manufacturing method of the display substrate provided by an embodiment of the present disclosure, forming the protruding portion on the first substrate includes: forming a separating layer on a second substrate; and patterning the separating layer to form the protruding portion, the first substrate includes the second substrate and the protruding portion.

For example, in the manufacturing method of the display substrate provided by an embodiment of the present disclosure, the manufacturing method further including: before forming the sub-pixel structure on the top surface of the protruding portion, forming a flexible base on the first substrate and the protruding portion; after forming the secondary sub-pixel structure on at least one of the plurality of lateral surfaces of the protruding portion, which intersect with the top surface, removing the second substrate and the protruding portion so as to enable the flexible base to form a concave-convex structure; and applying a flexible material on a side of the flexible base, which is away from the sub-pixel structure, so as to form a flexible protection layer, and filling the concave-convex structure with the flexible protection layer so as to form a boss.

For example, in the manufacturing method of the display substrate provided by an embodiment of the present disclosure, the sub-pixel structure includes a first anode provided on the top surface of the protruding portion and a first light-emitting layer provided on a side of the first anode, which is away from the protruding portion; and the secondary sub-pixel structure includes a second anode provided on at least one of the plurality of lateral surfaces and a second light-emitting layer arranged at the second anode and away from the protruding portion, the first anode and the second anode are formed by patterning the same metal layer, and the first light-emitting layer and the second light-emitting layer are formed by adopting the same evaporation process.

At least one embodiment of the present disclosure provides a display apparatus, including any one of the above display substrate.

BRIEF DESCRIPTION OF THE DRAWINGS

In order to clearly illustrate the technical solution of embodiments of the present disclosure, the drawings of the embodiments will be briefly described in the following, it is obvious that the drawings in the description are only related to some embodiments of the present disclosure and not limited to the present disclosure.

DETAILED DESCRIPTION

In order to make objects, technical details and advantages of the embodiments of the disclosure apparent, the technical solutions of the embodiments will be described in a clearly and fully understandable way in connection with the drawings related to the embodiments of the disclosure. Apparently, the described embodiments are just a part but not all of the embodiments of the disclosure. Based on the described embodiments herein, those skilled in the art can obtain other embodiment(s), without any inventive work, which should be within the scope of the disclosure.

Unless otherwise defined, all the technical and scientific terms used herein have the same meanings as commonly understood by one of ordinary skill in the art to which the present disclosure belongs. The terms "first", "second", etc., which are used in the description and the claims of the present application for disclosure, are not intended to indicate any sequence, amount or importance, but distinguish various components. The terms "comprise," "comprising", "include", "including", etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

In the study, an inventor of the present application notices that: in the practical application, in the process of stretching or bending a stretchable flexible display apparatus, a stretched or bent region may cause a problem that a pixel pitch is increased, resulting in phenomena such as brightness reduction, resolution reduction and the like in the stretched or bent region.

Figure 1:
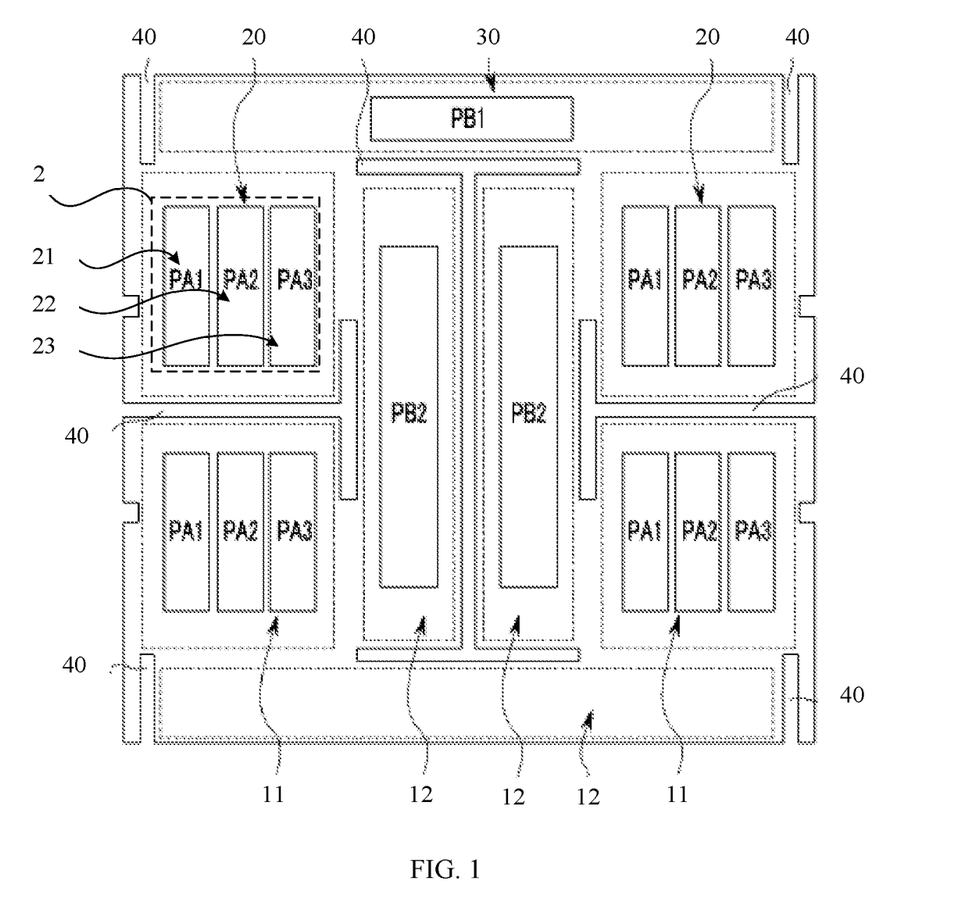
FIG. 1 is a plan schematic diagram of a stretchable display apparatus.

In order to avoid the above-mentioned phenomena and improve display quality of the stretchable flexible display apparatus, an additional sub-pixel can be arranged between adjacent pixels so as to avoid the phenomena of brightness reduction, resolution reduction and the like in the stretched or bent region. FIG. 1 is a plan schematic diagram of a stretchable display apparatus. As illustrated by FIG. 1, the stretchable display apparatus includes a plurality of openings 40 so as to implement stretchable display. In addition, the stretchable display apparatus includes a first display region 11 and a second display region 12 between the adjacent first display regions 11. The first display region 11 includes a pixel 2 including a plurality of sub-pixels 20; for example, the first display region 11 can include a red sub-pixel 21, a green sub-pixel 22 and a blue sub-pixel 23, and the red sub-pixel 21, the green sub-pixel 22 and the blue sub-pixel 23 constitute the pixel 2 together. The second display region 12 includes a compensating sub-pixel 30, and the compensating sub-pixel 30 can be any one of the red sub-pixel, the green sub-pixel and the blue sub-pixel. When the stretchable display apparatus is not stretched or bent, the compensating sub-pixel 30 in the second display region 12 does not emit light, and only the pixel 2 in the first display region 11 emits light; and when it is detected that the stretchable display apparatus is stretched or bent, the compensating sub-pixel 30 in the second display region 12 emits light to carry out compensation on brightness and a resolution, so as to avoid the phenomena of brightness reduction, resolution reduction and the like in the stretched or bent region.

However, in the stretchable flexible display apparatus as illustrated by FIG. 1, the pixel 2 and the compensating sub-pixel 30 are provided on the same surface, existence of the second display region 12 and the compensating sub-pixel 30 reduces a pixel density of the stretchable flexible display apparatus, and when the stretchable flexible display apparatus is not stretched or bent, the compensating sub-pixel 30 in the second display region 12 does not emit light, such that the stretchable flexible display apparatus cannot implement high-resolution display.

Embodiments of the present disclosure provide a display substrate and a manufacturing method thereof, and a display apparatus. The display substrate includes a flexible protection layer and a sub-pixel structure. The flexible protection layer includes a boss, the sub-pixel structure is provided on a top surface of the boss, the boss further includes a plurality of lateral surfaces intersecting with the top surface, and the display substrate further includes a secondary sub-pixel structure provided on at least one of the plurality of lateral surfaces. Upon the display substrate being not stretched or bent, the sub-pixel structure on the top surface of the boss emits light to display an image, but the secondary sub-pixel structure on the lateral surface of the boss cannot be exposed or an exposed area is relatively small; and when the display substrate is stretched or bent, the secondary sub-pixel structure on the lateral surface of the boss in a stretched or bent region can be exposed or the exposed area is increased, so that the display brightness and the resolution of the stretched or bent region can be compensated, thereby avoiding the phenomena of brightness reduction, resolution reduction and the like in the stretched or bent region. In addition, upon the display substrate being stretched or bent, the secondary sub-pixel structure on the lateral surface of the boss cannot be exposed or the exposed area is relatively small, and thus, the display substrate can implement high-resolution display upon implementing stretchable flexible display.

Hereinafter, the display substrate, the manufacturing method thereof, and the display apparatus, as provided by the embodiments of the present disclosure, will be described below with reference to the accompanying drawings.

Figure 2:
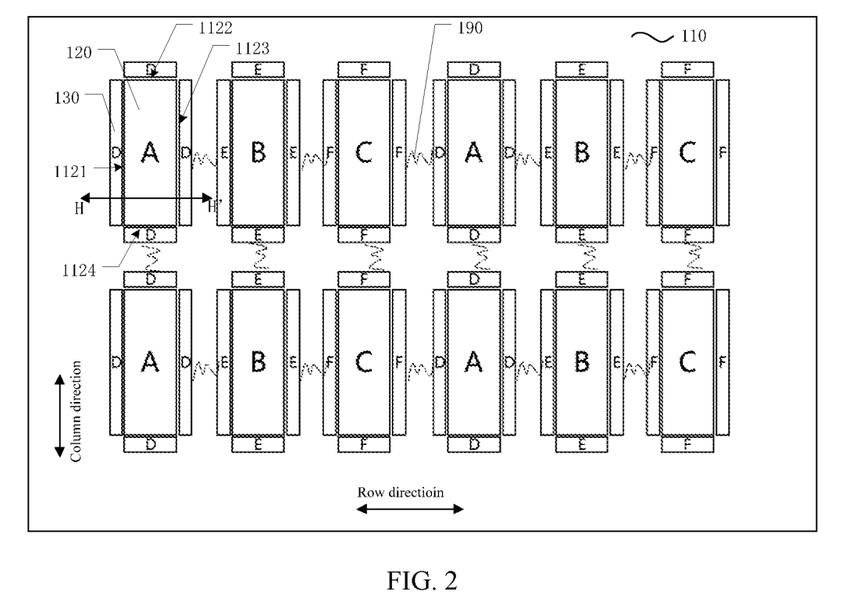
FIG. 2 is a sectional schematic diagram of a display substrate provided by an embodiment of the present disclosure.
Figure 3:
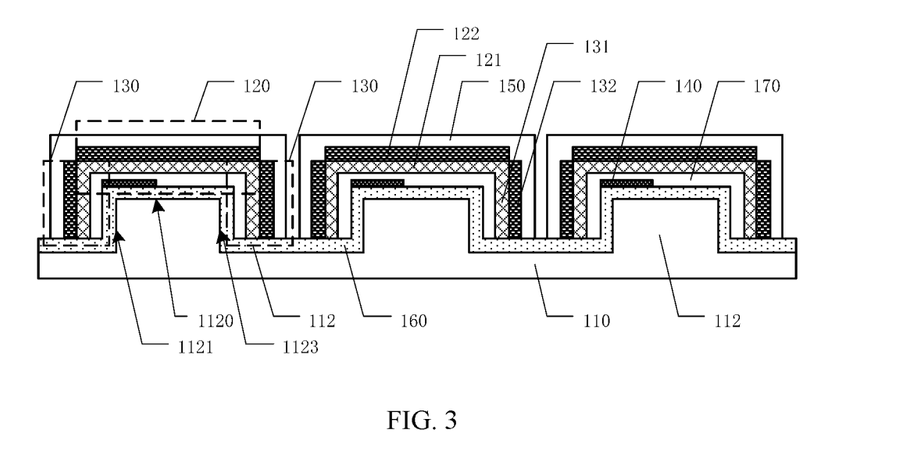
FIG. 3 is a sectional schematic diagram of a display substrate along a direction H-H' in FIG. 2, as provided by one embodiment of the present disclosure.

FIG. 2 is a top-view schematic diagram of a display substrate provided by one embodiment of the present disclosure. FIG. 3 is a sectional schematic diagram of a display substrate along a direction H-H' in FIG. 2, as provided by one embodiment of the present disclosure. As illustrated by FIG. 2 and FIG. 3, the display substrate includes a flexible protection layer 110 and a sub-pixel structure 120. The flexible protection layer 110 includes a boss 112, and the boss 112 includes a top surface 1120 and a plurality of lateral surfaces intersecting with the top surface 1120; and for example, as illustrated by FIGS. 2 and 3, upon an orthogonal projection of the boss 112 on the flexible protection layer 110 being of a rectangle shape, the boss 112 includes four lateral surfaces 1121, 1122, 1123 and 1124 intersecting with the top surface 1120. The sub-pixel structure 120 is provided on the top surface 1120 of the boss 112. The display substrate further includes a secondary sub-pixel structure 130 provided on at least one of the plurality of lateral surfaces. It should be noted that the above-mentioned top surface refers to a surface on a side of the boss, which is away from the flexible protection layer and where the boss is not arranged, and is also a surface for a user to observe.

Upon the display substrate provided by this embodiment being not stretched or bent, the sub-pixel structure on the top surface of the boss emits light to display an image, but the secondary sub-pixel structure on the lateral surface of the boss cannot be exposed or an exposed area is relatively small; and upon the display substrate being stretched or bent, the secondary sub-pixel structure on the lateral surface of the boss in a stretched or bent region can be exposed or the exposed area is increased, so that display brightness and a resolution of the stretched or bent region can be compensated, thereby avoiding the phenomena of brightness reduction, resolution reduction and the like in the stretched or bent region. In addition, upon the display substrate being stretched or bent, the secondary sub-pixel structure on the lateral surface of the boss cannot be exposed or the exposed area is relatively small, and thus, the display substrate can implement high-resolution display.

For example, a material of the flexible protection layer can include a flexible polymer so as to facilitate stretching and bending, e.g., a thermoplastic polyurethane elastomer, such as polydimethylsiloxane and the like. Certainly, the embodiments of the present disclosure include, but are not limited thereto, and the material of the flexible protection layer also can be polyethylene, polypropylene, polystyrene, polyethylene terephthalate, polyethylene naphthalate, polyimide and the like.

For example, in some examples, as illustrated by FIG. 3, a shape of a cross section of the boss 112 is a rectangle. In this case, upon the display substrate provided by this embodiment being not stretched or bent, the secondary sub-pixel structure 130 on the lateral surface of the boss 112 cannot be exposed, light emitted by the secondary sub-pixel structure 130 is perpendicular to a sight line of the user, the user cannot see the secondary sub-pixel structure 130, and upon the shape of the cross section of the boss 112 being a rectangle, an area occupied by the secondary sub-pixel structure 130 is relatively small, the sub-pixel structure 120 on the display substrate is tightly arranged and separately carries out display. Therefore, the display substrate can further improve the resolution. It is worth noting that, the embodiments of the present disclosure include, but are not limited thereto, and the shape of the cross section of the boss also can be any other shapes.

Figure 4:
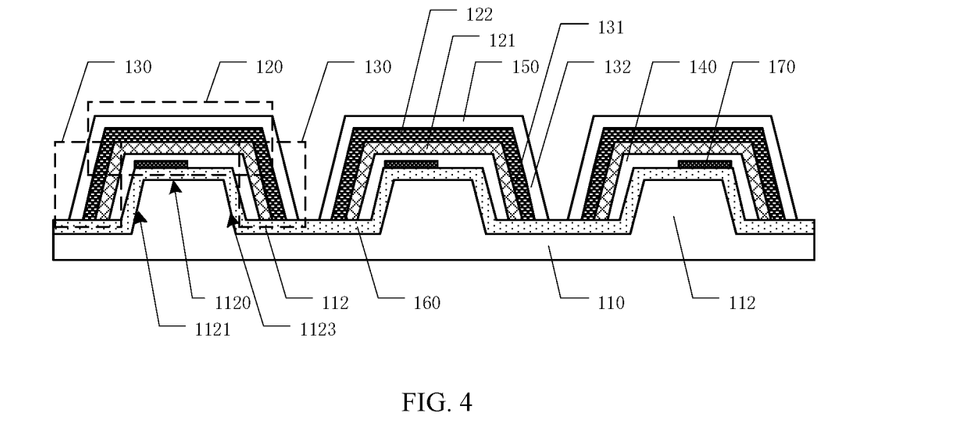
FIG. 4 is a sectional schematic diagram of another display substrate along the direction H-H' in FIG. 2, as provided by one embodiment of the present disclosure.

FIG. 4 is a sectional schematic diagram of another display substrate along the direction H-H' in FIG. 2, as provided by one embodiment of the present disclosure. As illustrated by FIG. 4, the shape of the cross section of the boss also can be a trapezoid. In this case, upon the display substrate being not stretched or bent, the secondary sub-pixel structure on the lateral surface of the boss is partially exposed, but the exposed area is relatively small; and upon the display substrate being stretched or bent, the exposed area of the secondary sub-pixel structure on the lateral surface of the boss in the stretched or bent region is increased, so that the display brightness and the resolution of the stretched or bent region can be compensated, thereby avoiding the phenomena of brightness reduction, resolution reduction and the like in the stretched or bent region. It should be noted that, upon the display substrate being not stretched or bent, the secondary sub-pixel structure on the lateral surface of the boss is partially exposed, but the exposed area is relatively small, the secondary sub-pixel structure may not carry out light-emitting display; and upon the display substrate being stretched or bent and the exposed area of the secondary sub-pixel structure on the lateral surface of the boss in the stretched or bent region is increased, the secondary sub-pixel structure can carry out light-emitting display so as to compensate the display brightness and the resolution of the stretched or bent region.

For example, in some examples, as illustrated by FIG. 3 and FIG. 4, the display substrate further includes a thin film transistor unit 140 which is provided on the top surface 1120 of the boss 112 and is respectively connected with the sub-pixel structure 120 and the secondary sub-pixel structure 130 so as to drive the sub-pixel structure 120 and the secondary sub-pixel structure 130 to emit light. Therefore, in one aspect, it is relatively easy to manufacture the thin film transistor unit 140 on the top surface 1120 of the boss 112, and the manufacturing difficulty of the display substrate can be reduced; and in the other aspect, the thin film transistor unit 140 can simultaneously drive the sub-pixel structure 120 and the secondary sub-pixel structure 130 without separately arranging a driving circuit for the secondary sub-pixel structure 130, so that a manufacturing process of the display substrate can be simplified and the cost is reduced. It should be noted that the above-mentioned thin film transistor unit is not limited to one thin film transistor; and for example, upon the display substrate is an organic light-emitting diode display substrate, the thin film transistor unit 140 can adopt a 2T1C structure and the like, i.e., include a plurality of thin film transistors. It is worth noting that in the embodiment of the present disclosure, the sub-pixel structure and the secondary sub-pixel structure can be synchronously driven, and also can be separately driven.

For example, in some examples, as illustrated by FIGS. 2 to 4, the display substrate includes a plurality of sub-pixel structures 120, the flexible protection layer 110 includes a plurality of bosses 112, and the plurality of sub-pixel structures 120 and the plurality of bosses 112 are arranged in one-to-one correspondence. In other words, the number of the sub-pixel structures 120 is equal to that of the bosses 112 on the flexible protection layer 110, and each of the plurality of bosses 112 is provided with one sub-pixel structure 120.

For example, in some examples, as illustrated by FIGS. 2 to 4, the plurality of bosses 112 are arranged in an array, and in this case, the plurality of bosses 112 have one row direction and one column direction; and the secondary sub-pixel structures 130 are provided on two of the plurality of lateral surfaces, which intersect with the row direction of the plurality of bosses 112. For example, as illustrated by FIGS. 2 to 4, the secondary sub-pixel structures 130 are provided on lateral surfaces 1121 and 1123 of the plurality of lateral surfaces, which intersect with the row direction of the plurality of bosses 112. Upon the display substrate being stretched or bent in the row direction, the secondary sub-pixel structures 130 on the lateral surfaces 1121 and 1123 of the boss in the stretched or bent region can be exposed or the exposed area is increased, so that the display brightness and the resolution of the stretched or bent region can be compensated, thereby avoiding the phenomena of brightness reduction, resolution reduction and the like in the stretched or bent region.

For example, in some examples, as illustrated by FIG. 2, the secondary sub-pixel structures 130 are also provided on two lateral surfaces in the plurality of lateral surfaces, which intersect with the column direction of the plurality of bosses 112, e.g., lateral surfaces 1122 and 1124. Upon the display substrate being stretched or bent in the column direction, the secondary sub-pixel structure 130 on the lateral surfaces 1121 and 1123 of the boss in the stretched or bent region can be exposed or the exposed area is increased, so that the display brightness and the resolution of the stretched or bent region can be compensated, thereby avoiding the phenomena of brightness reduction, resolution reduction and the like in the stretched or bent region.

For example, in some examples, as illustrated by FIG. 2, the secondary sub-pixel structures 130 can be provided on each of the plurality of lateral surfaces, e.g., lateral surfaces 1121, 1122, 1123 and 1124. Uon the display substrate being stretched or bent in different directions, the secondary sub-pixel structures 130 on the lateral surfaces of the boss of the stretched or bent region can all be exposed or the exposed area is increased, so that the display brightness and the resolution of the stretched or bent region can be compensated, thereby avoiding the phenomena of brightness reduction, resolution reduction and the like in the stretched or bent region.

For example, in some examples, as illustrated by FIGS. 3 and 4, the display substrate further includes an encapsulation layer 150, which is provided on a side of the sub-pixel structure 120 and the secondary sub-pixel structure 130, which is away from the boss 112. The encapsulation layer 150 coats the sub-pixel structure 120 and the secondary sub-pixel structure 130. Therefore, the sub-pixel structure 120 and the secondary sub-pixel structure 130 are protected and prevented from being corroded by water and oxygen. In addition, as illustrated by FIGS. 3 and 4, an interval is formed between two portions of the encapsulation layer 150 respectively provided on adjacent ones of the plurality of bosses 112, so that upon the display substrate being stretched or bent, distances between the encapsulation layers 150 on the adjacent bosses 112 are relatively easy to change.

For example, in some examples, as illustrated by FIGS. 3 and 4, the display substrate further includes a flexible base 160 which is at least arranged between the boss 112 and the sub-pixel structure 120 as well as the secondary sub-pixel structure 130. In other words, the flexible base 160 is arranged between the boss 112 and the sub-pixel structure 120 and between the boss 112 and the secondary sub-pixel structure 130. For example, as illustrated by FIGS. 3 and 4, the entire surface of the flexible base 160 is provided on the flexible protection layer 110, so that the sub-pixel structure 120 and the secondary sub-pixel structure 130 do not need to be directly produced on the flexible protection layer 110.

For example, in some examples, as illustrated by FIGS. 3 and 4, the flexible base 160 is provided on the flexible protection layer 110, and thus, the flexible base 160 forms a concave-convex structure, i.e., the flexible base 160 protrudes towards a direction where the sub-pixel structure 120 is positioned along a profile of the boss 110. It should be noted that in the concave-convex structure formed by the flexible base 160, thicknesses of the flexible base at different positions are approximately equal.

For example, a material of the flexible base can include polyimide.

For example, in some examples, as illustrated by FIGS. 3 and 4, the sub-pixel structure 120 includes a first anode 121 provided on the top surface 1120 of the boss 112 and a first light-emitting layer 122 provided on a side of the first anode 121, which is away from the boss 112; and the secondary sub-pixel structure 130 includes a second anode 131 provided on at least one of the plurality of lateral surfaces 120 and a second light-emitting layer 132 arranged at the second anode 131 and away from the boss 112.

For example, in some examples, as illustrated by FIGS. 3 and 4, the first anode 121 and the second anode 131 are connected. For example, the first anode 121 and the second anode 131 are of the same metal pattern, and are obtained from the same metal layer by a patterning process.

For example, a material of the first anode includes silver; and a material of the second anode includes silver.

For example, in some examples, as illustrated by FIG. 2, the display substrate further includes a connecting line 190 between the adjacent bosses (not shown). The connecting line 190 can be used as a signal connecting line between the adjacent sub-pixel structure 120 and secondary sub-pixel structure 130. For example, the connecting line 190 can be of a curved shape to ensure that the display substrate does not break when stretched or bent.

For example, in some examples, as illustrated by FIGS. 3 and 4, the display substrate further includes an inorganic layer 170 positioned between the thin film transistor unit 140 and the first anode 121, between the flexible base 160 and the first anode 121 and between the flexible base 160 and the second anode 131.

For example, in some examples, as illustrated by FIGS. 3 and 4, a material of the first light-emitting layer 122 is the same with a material of the second light-emitting layer 132. In other words, the first light-emitting layer 122 and the second light-emitting layer 132 can emit light with the same color, so that the sub-pixel structure and the secondary sub-pixel structure emit light with the same color. Certainly, the embodiments of the present disclosure include, but are not limited thereto, and the first light-emitting layer and the second light-emitting layer are configured to emit the light with different colors.

For example, in some examples, as illustrated by FIGS. 3 and 4, the first light-emitting layer 122 can emit red light, green light or blue light. Therefore, the sub-pixel structure emitting the red light, the sub-pixel structure emitting the green light and the sub-pixel structure emitting the blue light can constitute one pixel, so that full-color display can be carried out.

Figure 5:
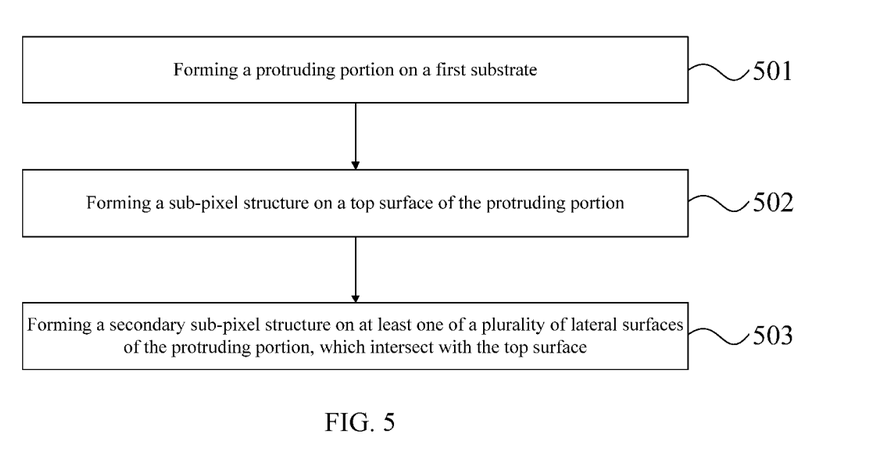
FIG. 5 is a flow chart of a manufacturing method of a display substrate, as provided by one embodiment of the present disclosure.

For example, in some examples, as illustrated by FIGS. 3 and 4, the first anode 121 and the second anode 131 are electrically connected. Certainly, the embodiments of the present disclosure include, but are not limited thereto, and the first anode 121 and the second anode 131 also can be insulated mutually. An embodiment of the present disclosure further provides a manufacturing method of a display substrate. FIG. 5 is a flow chart of a manufacturing method of a display substrate, as provided by one embodiment of the present disclosure. As illustrated by FIG. 5, the manufacturing method of the display substrate includes steps S501 to S503.

S501: forming a protruding portion on a first substrate.

Figure 6A:
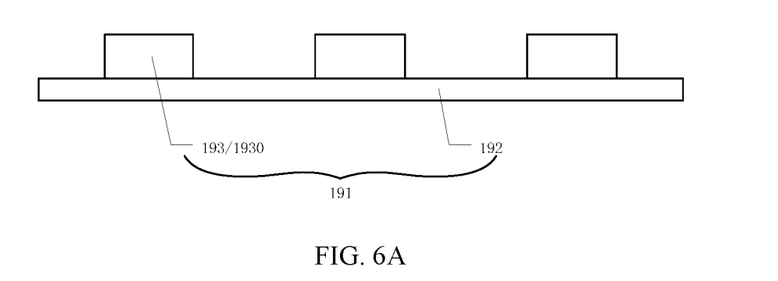
FIGS. 6A to 6D are schematic diagrams of steps of a manufacturing method of a display substrate, as provided by one embodiment of the present disclosure.

For example, as illustrated by FIG. 6A, the protruding portion 193 is formed on the first substrate 191.

S502: forming a sub-pixel structure on a top surface of the protruding portion.

Figure 6B:
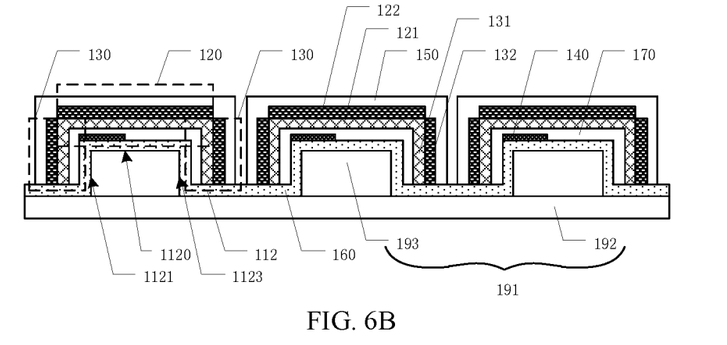

For example, as illustrated by FIG. 6B, the sub-pixel structure 120 is formed on the top surface of the protruding portion 193.

S503: forming a secondary sub-pixel structure on at least one of a plurality of lateral surfaces of the protruding portion, which intersect with the top surface.

For example, as illustrated by FIG. 6B, the secondary sub-pixel structure 130 is formed on a plurality of lateral surfaces of the protruding portion 193, which intersect with the top surface. Upon the display substrate manufactured by the above-mentioned manufacturing method of the display substrate being not stretched or bent, the sub-pixel structure on the top surface of the protruding portion emits light to display an image, and the secondary sub-pixel structure on the lateral surface of the protruding portion cannot be exposed or an exposed area is relatively small; and upon the display substrate being stretched or bent, the secondary sub-pixel structure on the lateral surface of the protruding portion in a stretched or bent region can be exposed or the exposed area is increased, so that display brightness and a resolution of the stretched or bent region can be compensated, thereby avoiding the phenomena of brightness reduction, resolution reduction and the like in the stretched or bent region. In addition, upon the display substrate being not stretched or bent, the secondary sub-pixel structure on the lateral surface of the protruding portion cannot be exposed or the exposed area is relatively small, and thus, the display substrate can implement high-resolution display.

For example, upon the sub-pixel structure or the secondary sub-pixel structure adopting an organic light-emitting element, a deposition process, a patterning process, an evaporation process and the like can be adopted to form the sub-pixel structure on the top surface of the protruding portion or form the secondary sub-pixel structure on at least one of the plurality of lateral surfaces of the protruding portion, which intersect with the top surface.

For example, in some examples, as illustrated by FIG. 6A, the step of forming the protruding portion 193 on the first substrate 191 can include: forming a separating layer 1930 on a second substrate 192; and patterning the separating layer 1930 to form the protruding portion 193. In other words, the first substrate 191 includes the second substrate 192 and the protruding portion 193, and the protruding portion 193 is formed on the first substrate 191 by patterning the separating layer 1930.

For example, the second substrate can be a base substrate, and can adopt a rigid substrate such as a glass substrate, a quartz substrate, a plastic substrate and the like, so as to facilitate a subsequent forming process.

For example, a material of the separating layer can be selected from one or more of silicon nitride, silicon oxide and silicon oxynitride.

For example, the above-mentioned step of patterning the separating layer to form the protruding portion can adopt a dry etching or wet process to etch the separating layer to form the protruding portion.

Figure 6C:
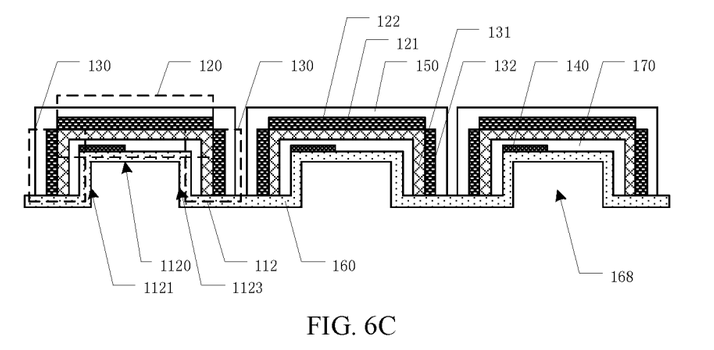
Figure 6D:
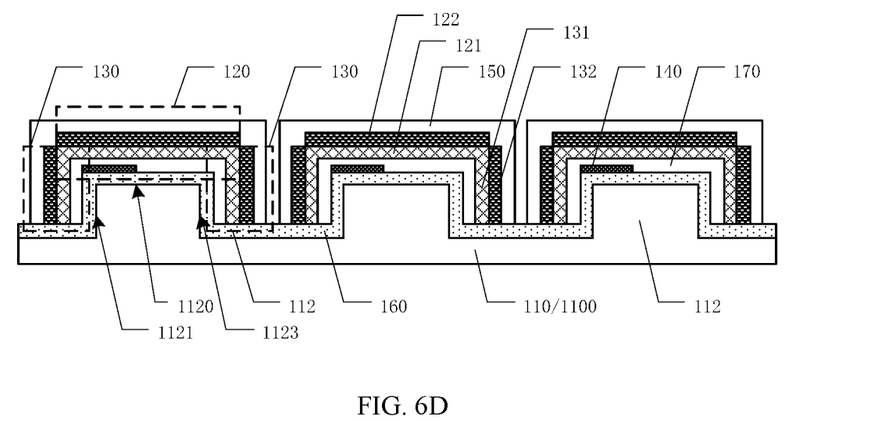

For example, in some examples, as illustrated by FIG. 6B, the manufacturing method of the display substrate further includes: before forming the sub-pixel structure 120 on the top surface of the protruding portion 193, forming a flexible base 160 on the first substrate 191 and the protruding portion 193; as illustrated by FIG. 6C, after forming the secondary sub-pixel structure 193 on at least one of the plurality of lateral surfaces of the protruding portion 193, which intersect with the top surface, removing the second substrate 192 and the protruding portion 193 so as to enable the flexible base 160 to form a concave-convex structure 168; and then, as illustrated by FIG. 6D, applying a flexible material 1100 on a side of the flexible base 160, which is away from the sub-pixel structure 120, so as to form a flexible protection layer 110, and filling the concave-convex structure 168 with the flexible protection layer 110 so as to form a boss 112. In the manufacturing method of the display substrate, firstly, parts such as the protruding portion, the sub-pixel structure, the secondary sub-pixel structure and the like are formed on the second substrate (for example, the rigid substrate), then the second substrate and the protruding portion are removed, and finally, the flexible protection layer is formed, so that manufacturing of the stretchable flexible display substrate can be implemented, the manufacturing difficulty can be reduced and product yield can be improved. It should be noted that, in the concave-convex structure formed by the above-mentioned flexible base, thicknesses of the flexible base at different positions can be approximately equal, and it is just that the flexible base protrudes towards a direction where the sub-pixel structure is positioned along a profile of the protruding portion.

For example, a material of the flexible base can include polyimide, certainly, the material of the flexible base also can be selected from other proper materials, and the embodiments of the present disclosure do not make any limit thereto.

For example, the above-mentioned step of removing the second substrate and the protruding portion can adopt a physical separating process or an etching process, and the embodiments of the present disclosure are not limited thereto.

For example, in some examples, the sub-pixel structure includes a first anode provided on the top surface of the protruding portion and a first light-emitting layer provided on a side of the first anode, which is away from the protruding portion; and the secondary sub-pixel structure includes a second anode provided on at least one of the plurality of lateral surfaces and a second light-emitting layer provided on a side of the second anode away from the protruding portion, For example, in some examples, the first anode and the second anode are formed by patterning the same metal layer, and the first light-emitting layer and the second light-emitting layer are formed by adopting the same evaporation process.

For example, firstly, a metal layer can be deposited on the first substrate formed with the protruding portion; then the metal layer is patterned (for example, etched) to form the first anode of the sub-pixel structure, the second anode of the secondary sub-pixel structure and a connecting line between the second anodes on the adjacent bosses; and then the first light-emitting layer and the second light-emitting layer are simultaneously evaporated on a side of the first anode, which is away from the boss, and a side of the second anode, which is away from the boss.

For example, the connecting line can be of a curved shape to ensure that the display substrate does not break when being stretched or bent.

An embodiment of the present disclosure further provides a display apparatus, which includes the display substrate as described in any one of the above-mentioned examples. Upon the display apparatus being not stretched or bent, the sub-pixel structure on the top surface of the boss emits light to display an image, the secondary sub-pixel structure on the lateral surface of the boss cannot be exposed or the exposed area is relatively small; and upon the display apparatus being stretched or bent, the secondary sub-pixel structure on the lateral surface of the boss in a stretched or bent region can be exposed or the exposed area is increased, so that display brightness and a resolution of the stretched or bent region can be compensated, thereby avoiding the phenomena of brightness reduction, resolution reduction and the like in the stretched or bent region. In addition, upon the display substrate being stretched or bent, the secondary sub-pixel structure on the lateral surface of the boss cannot be exposed or the exposed area is relatively small, and thus, the display apparatus can implement high-resolution display.

For example, in some examples, the display apparatus can be any product or part with a display function, such as a television, a computer, a mobile phone, a digital camera, a digital photo frame, a navigator, a watch, a tablet personal computer, a notebook computer and the like.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto, the protection scope of the present disclosure should be based on the protection scope of the claims.

What is claimed is:

1. A display substrate, comprising:
    a flexible protection layer; and
    a sub-pixel structure,
    wherein the flexible protection layer comprises a boss, the sub-pixel structure is provided on a top surface of the boss, and the boss further comprises a plurality of lateral surfaces intersecting with the top surface, the display substrate further comprises a secondary sub-pixel structure provided on at least one of the plurality of lateral surfaces.

2. The display substrate according to claim 1, wherein a shape of a cross section of the boss comprises a rectangle or a trapezoid, and the cross section is perpendicular to the top surface.

3. The display substrate according to claim 1, further comprising:
    a thin film transistor unit, provided on the top surface of the boss,
    wherein the thin film transistor unit is connected with the sub-pixel structure and the secondary sub-pixel structure, and configured to drive the sub-pixel structure and the secondary sub-pixel structure to emit light.

4. The display substrate according to claim 3, comprising:
    a plurality of sub-pixel structure,
    wherein the flexible protection layer comprises a plurality of bosses, and the plurality of sub-pixel structures and the plurality of bosses are arranged in one-to-one correspondence.

5. The display substrate according to claim 4, further comprising: an encapsulation layer, provided on a side of the sub-pixel structure and the secondary sub-pixel structure, which is away from the boss,
    wherein the encapsulation layer coats the sub-pixel structure and the secondary sub-pixel structure, and an interval is formed between two portions of the encapsulation layer respectively provided on adjacent ones of the plurality of bosses.

6. The display substrate according to claim 4, further comprising:
    a flexible base,
    wherein the flexible base forms a concave-convex structure on the flexible protection layer, the sub-pixel structure and the secondary sub-pixel structure are provided on a side of the flexible base away from the flexible protection layer.

7. The display substrate according to claim 1, comprising:
    a plurality of sub-pixel structures,
    wherein the flexible protection layer comprises a plurality of bosses, and the plurality of sub-pixel structures and the plurality of bosses are arranged in one-to-one correspondence.

8. The display substrate according to claim 7, wherein the plurality of bosses are arranged in an array along a row direction and a column direction, and the secondary sub-pixel structure is provided on a lateral surface in the plurality of lateral surfaces, which intersects with the row direction.

9. The display substrate according to claim 8, wherein the secondary sub-pixel structure is provided on a lateral surface in the plurality of lateral surfaces, which intersects with the column direction.

10. The display substrate according to claim 7, further comprising: an encapsulation layer, provided on a side of the sub-pixel structure and the secondary sub-pixel structure, which is away from the boss,
    wherein the encapsulation layer coats the sub-pixel structure and the secondary sub-pixel structure, and an interval is formed between two portions of the encapsulation layer respectively provided on adjacent ones of the plurality of bosses.

11. The display substrate according to claim 1, wherein the sub-pixel structure comprises a first anode provided on the top surface of the boss and a first light-emitting layer provided on a side of the first anode, which is away from the boss; and the secondary sub-pixel structure comprises a second anode provided on at least one of the plurality of lateral surfaces and a second light-emitting layer provided on a side of the second anode, which is away from the boss.

12. The display substrate according to claim 11, wherein the first anode and the second anode are electrically connected.

13. The display substrate according to claim 11, wherein the first light-emitting layer and the second light-emitting layer are configured to emit light with the same color.

14. A display apparatus, comprising the display substrate according to claim 1.

15. A manufacturing method of a display substrate, comprising:
   forming a protruding portion on a first substrate;
   forming a sub-pixel structure on a top surface of the protruding portion; and
   forming a secondary sub-pixel structure on at least one of a plurality of lateral surfaces of the protruding portion, which intersect with the top surface,
   wherein the manufacturing method further comprises:
   before forming the sub-pixel structure on the top surface of the protruding portion, forming a flexible base on the first substrate and the protruding portion;
   after forming the secondary sub-pixel structure on at least one of the plurality of lateral surfaces of the protruding portion, which intersect with the top surface, removing a second substrate and the protruding portion so as to enable the flexible base to form a concave-convex structure; and applying a flexible material on a side of the flexible base, which is away from the sub-pixel structure, so as to form a flexible protection layer, and filling the concave-convex structure with the flexible protection layer so as to form a boss.

16. The manufacturing method of the display substrate according to claim 15, wherein forming the protruding portion on the first substrate comprises:
   forming a separating layer on the second substrate; and
   patterning the separating layer to form the protruding portion,
   wherein the first substrate comprises the second substrate and the protruding portion.

17. The manufacturing method of the display substrate according to claim 15, wherein the sub-pixel structure comprises a first anode provided on the top surface of the protruding portion and a first light-emitting layer provided on a side of the first anode, which is away from the protruding portion; and the secondary sub-pixel structure comprises a second anode provided on at least one of the plurality of lateral surfaces and a second light-emitting layer arranged at the second anode and away from the protruding portion,
   the first anode and the second anode are formed by patterning the same metal layer, and the first light-emitting layer and the second light-emitting layer are formed by adopting the same evaporation process.

* * * * *